United States Patent [19]
Yuan et al.

[11] Patent Number: 6,146,700
[45] Date of Patent: Nov. 14, 2000

[54] PRETREATING SOLUTION FOR ELECTROLESS PLATING, ELECTROLESS PLATING BATH AND ELECTROLESS PLATING PROCESS

[75] Inventors: Benzhen Yuan; Motoo Asai, both of Gifu, Japan

[73] Assignee: Ibiden Co., Ltd., Gifu, Japan

[21] Appl. No.: 08/885,917

[22] Filed: Jun. 30, 1997

Related U.S. Application Data

[63] Continuation-in-part of application No. 08/696,909, filed as application No. PCT/JP95/02014, Oct. 3, 1995, abandoned.

[30] Foreign Application Priority Data

Dec. 27, 1994 [JP] Japan .................................. 6-325584
Mar. 14, 1995 [JP] Japan .................................. 7-54576
Jun. 30, 1995 [JP] Japan .................................. 7-165258

[51] Int. Cl.$^7$ .............................. B05D 3/10; B05D 1/18; B05D 1/36
[52] U.S. Cl. ......................... 427/304; 427/305; 427/327; 427/405; 427/437; 427/443.1
[58] Field of Search ..................... 427/305, 304, 427/327, 405, 437, 443.1

[56] References Cited

U.S. PATENT DOCUMENTS

| | | |
|---|---|---|
| 3,716,462 | 2/1973 | Jensen . |
| 4,234,628 | 11/1980 | Durose . |
| 4,478,883 | 10/1984 | Bupp et al. . |
| 4,482,596 | 11/1984 | Gulla et al. . |
| 4,579,882 | 4/1986 | Kanbe et al. . |
| 4,639,380 | 1/1987 | Amelio et al. . |
| 4,693,907 | 9/1987 | Ishikawa . |
| 4,834,796 | 5/1989 | Kondo et al. . |
| 4,869,930 | 9/1989 | Clarke et al. ........................... 427/252 |
| 4,948,707 | 8/1990 | Johnson et al. . |
| 4,985,076 | 1/1991 | Iacovangelo ........................... 106/1.26 |
| 5,039,338 | 8/1991 | Kondo et al. . |
| 5,320,667 | 6/1994 | Gesemann et al. . |
| 5,509,557 | 4/1996 | Jimarez et al. ........................... 216/95 |

FOREIGN PATENT DOCUMENTS

| | | |
|---|---|---|
| 58-52466 | 3/1983 | Japan . |
| 63-11676 | 1/1988 | Japan . |
| 63-129692 | 6/1988 | Japan . |
| 1168871 | 7/1989 | Japan . |
| 1176078 | 7/1989 | Japan . |
| 230768 | 2/1990 | Japan . |
| 230769 | 2/1990 | Japan . |
| 23077 | 2/1990 | Japan . |
| 59-119786 | 12/1991 | Japan . |

OTHER PUBLICATIONS

An English Language Abstract of JP 58–52466.
An English Language Abstract of JP 63–11676.
An English Language Abstract of JP 1–176078.
English Language Abstract of JP 2–30769.
English Language Abstract of JP 63–129692.
English Language Abstract of JP 2–30768.
English Language Abstract of JP 2–3070.
English Language Abstract of JP 1–168871.

*Primary Examiner*—Shrive Beck
*Assistant Examiner*—Michael Barr
*Attorney, Agent, or Firm*—Greenblum & Bernstein, P.L.C.

[57] ABSTRACT

As an electroless plating technique capable of surely promoting the plating reaction without Pd substitution reaction and fastening the plating deposition, there are proposed an electroless plating method of subjecting a primary plated film (or metal film) formed on a substrate to a secondary plating (or electroless plating), characterized in that the secondary plating is carried out after a surface potential of the primary plated film is adjusted so as to be more base than such a most base surface potential that a surface current density of the primary plated film is zero in an electroless plating solution for the secondary plating; and a pretreating solution for electroless plating comprising an alkali solution, reducing agent and complexing agent; and an electroless plating bath suitable for use in this method.

35 Claims, 5 Drawing Sheets

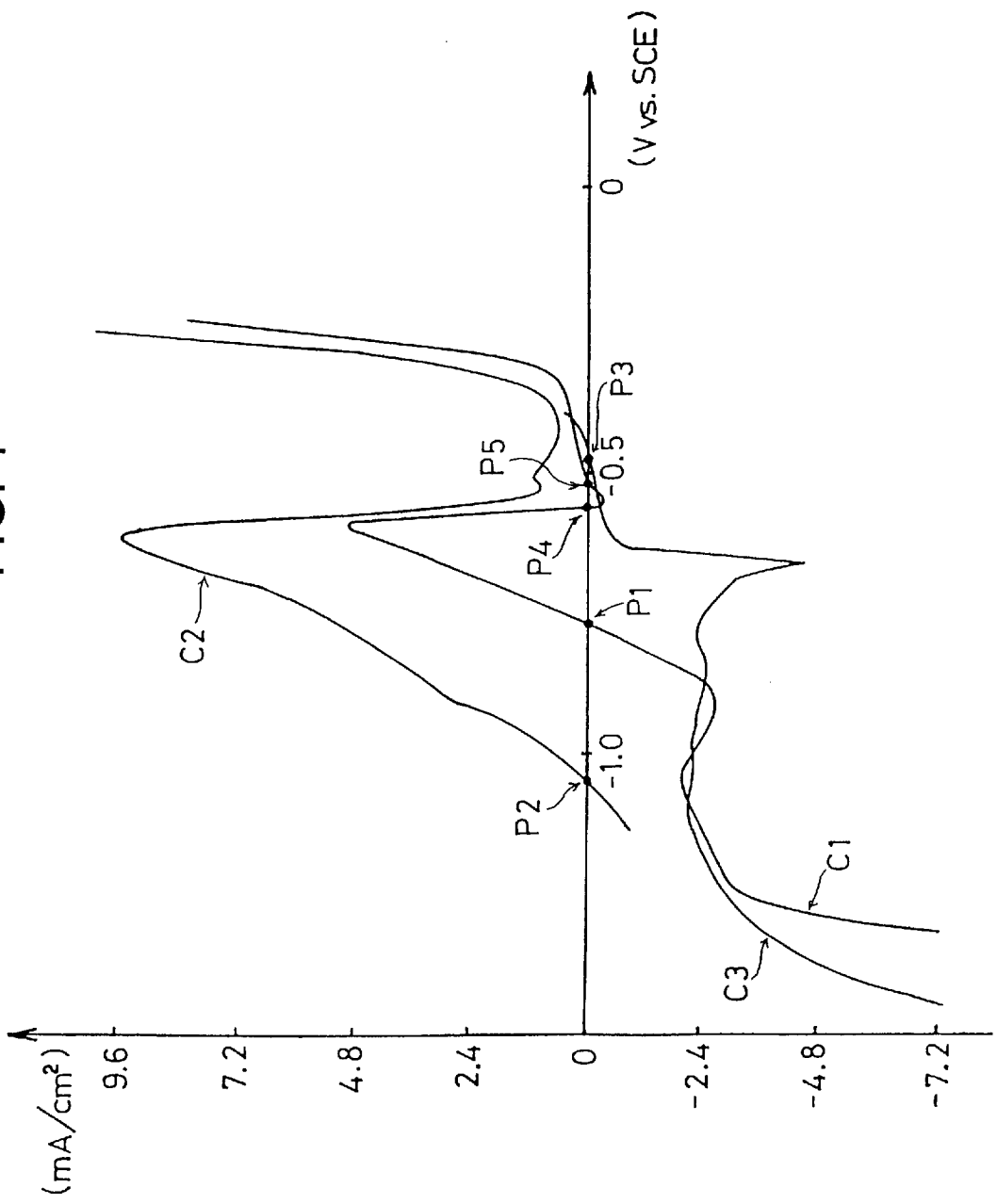

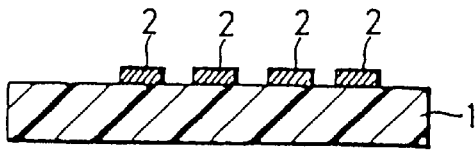
FIG. 2a
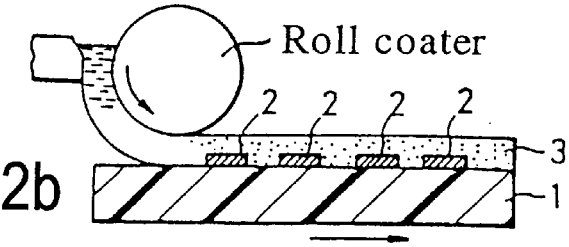
FIG. 2b
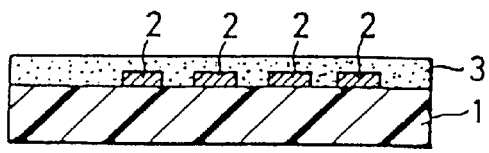
FIG. 2c
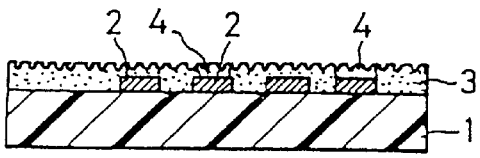
FIG. 2d
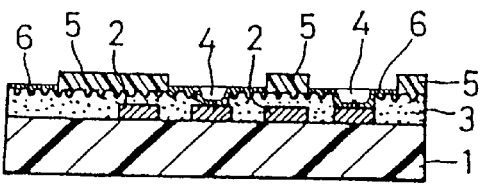
FIG. 2e
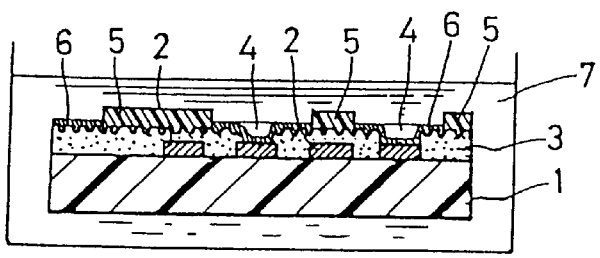
FIG. 2f
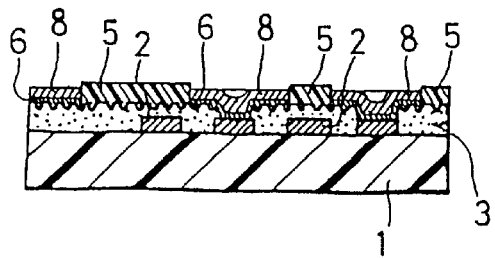
FIG. 2g
FIG. 2h

PRETREATING SOLUTION FOR ELECTROLESS PLATING, ELECTROLESS PLATING BATH AND ELECTROLESS PLATING PROCESS

This application is a continuation-in-part application of the application Ser. No. 08/696,909 filed Aug. 23, 1996, which is a National Stage application of International Application No. PCT/JP95/02014 filed Oct. 3, 1995, now abandoned.

TECHNICAL FIELD

This invention relates to a pretreating solution for electroless plating, an electroless plating bath and an electroless plating process, and more particularly to a pretreating solution for electroless plating effective in the formation of a conductor pattern in the production of a printed circuit board, an electroless plating bath and an electroless plating technique using the same.

BACKGROUND ART

As the technique for a production of printed circuit boards, there has widely been known so-called additive process of forming a conductor pattern on a substrate through electroless copper plating treatment. In this process, there is generally adopted a method, in which a catalyst nucleus is applied to an insulating substrate and an electroless plated thin film (primary plating) is directly formed thereon and then an electroless plated thick film (secondary plating) is formed on the plated metal surface, as the electroless plating treatment for the formation of the conductor pattern.

In such an electroless plating treatment, the primary plated film first deposits around the catalyst nucleus applied onto the surface of the insulating substrate and the deposition of the secondary plated film proceeds on the metal constituting the primary plated film after the formation of the primary plated film layer. Therefore, different properties are required in the primary plating and the secondary plating.

That is, when the plated film is deposited around the catalyst nucleus formed on the surface of the insulating substrate as in the primary plating, it is required that the deposited particles are fine and the thickness of the plated film is uniform.

When the plated film is deposited on the metal constituting the primary plated film as a nucleus as in the secondary plating, it is required to accelerate the deposition rate to increase productivity.

Particularly, the usual electroless plating treatment uses a plating solution containing ethylenediamine tetraacetate (hereinafter abbreviated as EDTA) as a complexing agent and which is slow in the deposition rate, so that it is necessary to accelerate the deposition rate of the secondary plating.

On the other hand, JP-A-1-168871 and JP-A-2-30770 have proposed an electroless plating solution containing triethanol amine (hereinafter abbreviated as TEA) as a complexing agent as a means for accelerating the deposition rate.

However, the electroless plating solution containing TEA as the complexing agent can be used in the primary plating to be conducted after the application of catalyst nucleus such as Pd or the like without problems, but when such a solution is used in the secondary plating for depositing the metal constituting the primary plated film as a nucleus, the initial plating deposition is very poor and there are problems such as lack of deposition, reaction termination and the like.

In order to solve the problem in the secondary plating, there has been proposed a method of improving the bath reactivity by increasing a concentration of a reducing agent such as formaldehyde (HCHO) or the like added to the electroless plating solution containing TEA as a complexing agent (not less than 3 cc/l (0.037 mol/l)).

In this method, however, the reducing agent strongly reduces copper ions in the plating solution to cause the deposition of unnecessary metallic copper, so that there are troubles such as occurrence of nodule and decomposition of the plating solution.

Furthermore, there is a method in which a catalyst nucleus such as Pd or the like is applied onto the plated film formed by the primary plating and subjected to the secondary plating as another means for solving the problem in the secondary plating.

In this method, however, the cost undesirably increases, and also it is difficult to apply and fix the Pd catalyst nucleus to the metal film different from the insulating substrate and hence there is a problem of abnormal deposition due to drop-off of Pd catalyst nucleus.

On the contrary, there have hitherto been proposed the following pretreating solutions for electroless plating:

① a pretreating solution having a chemical copper plating composition other than copper complexing agent and copper compound (JP-A-63-129692);

② a pretreating solution for electroless plating consisting of alkali hydroxide, metal complexing agent and alkali metal halogenide (JP-A-2-30768); and ③ a pretreating solution for electroless plating consisting of acid, metal complexing agent and reducing agent (JP-A-2-30769).

However, these pretreating solutions are solutions for depositing the plated film onto the insulating surface, but are not solutions for depositing the secondary plated film onto the surface of the primary plated film and hence they do not accelerate the initial deposition rate in the secondary plating.

As mentioned above, it is difficult to improve the initial deposition of the secondary plating without any troubles in the above conventional techniques, so that there is no practical method of accelerating the deposition rate of the secondary plating.

It is an object of the invention to solve the aforementioned problems of the conventional techniques and to provide a technique for electroless plating treatment capable of improving the initial deposition of the secondary plating without any drawbacks.

It is another object of the invention to accelerate the plating deposition rate in the secondary plating.

DISCLOSURE OF THE INVENTION

The inventors have made various studies to achieve the above objects and found that a cause of degradation of initial deposition of the secondary plating is due to surface potential of the primary plated film.

That is, according to the conventional technique, the surface potential of the primary plated film at the time of conducting the secondary plating is more noble than the surface potential depositing the secondary plated film (hybrid potential of plating reaction), so that a surface potential of a surface current density of 0 (metastable state) exists between the surface potential of the primary plated film and the hybrid potential thereof in the secondary plating solution. Therefore, it has been found that the surface potential of the primary plated film is not shifted to the potential of depositing the secondary plated film and hence the initial deposition of the secondary plated film is degraded.

The inventors have made further studies based on the above knowledge and discovered that the initial deposition of the secondary plating can be improved by adjusting the surface potential of the primary plated film with a pretreatment. Thus, the above objects of the invention are realized by conducting the secondary plating after the surface potential of the primary plated film is made more negative than hybrid potential by the pretreatment, which is entirely reverse of the conventional technique.

And also, it has been found that similar action and effect are obtained even in secondary plating solutions containing a completing agent other than TEA.

Namely, the invention fundamentally involves
(1) A pretreating solution for electroless plating comprising an alkali solution, a reducing agent and a complexing agent;
(2) A pretreating solution for electroless plating comprising an alkali, a reducing agent, a completing agent and a solvent dissolving them;
(3) An electroless plating bath comprising:
   a tank of a pretreating solution for electroless plating comprising an alkali solution, a reducing agent and a complexing agent; and
   a tank of an electroless plating solution comprising a pH adjusting agent, a reducing agent, a metal ion and a complexing agent;
(4) An electroless plating bath comprising:
   a tank of a pretreating solution for electroless plating comprising an alkali, a reducing agent, a complexing agent and a solvent dissolving them; and
   a tank of an electroless plating solution comprising a pH adjusting agent, a reducing agent, a metal ion and a completing agent;
(5) An electroless plating method comprising:
   subjecting a substrate to a primary plating;
   after the primary plating, pretreating the substrate with a pretreating solution for electroless plating comprising an alkali solution, a reducing agent and a complexing agent; and
   after the pretreating, subjecting the substrate to a secondary plating;
(6) An electroless plating method comprising:
   subjecting a substrate to a primary plating;
   after the primary plating, pretreating the substrate with a pretreating solution for electroless plating comprising an alkali, a reducing agent, a completing agent and a solvent for dissolving the same; and
   after the pretreating, subjecting the substrate to a secondary plating; or
(7) An electroless plating method comprising:
   subjecting a substrate to a primary plating;
   after the primary plating, adjusting a surface potential of a primary plated film formed on the substrate so as to be more base than the most base surface potential in which a surface current density of the primary plated film is zero in an electroless plating solution for the secondary plating;
   after the adjusting, subjecting the substrate to a secondary plating.

The term "primary plating" used herein means a treatment for depositing a plated film on a catalyst nucleus for plating. In general, the plated film is thinner than that of the secondary plating. As the primary plating, use may be made of electroless copper plating, electroless nickel plating and electroless copper-nickel-phosphorus alloy plating.

The term "secondary plating" used herein means a treatment for further depositing a plated film on the primary plated film or after a treatment such as plating or the like is made on the primary plated film. In general, the plated film of secondary plating is thicker than that of the primary plating. It is desirable that the secondary plating uses an electroless copper plating solution prepared by dissolving a pH adjusting agent, a reducing agent and a complexing agent in a solvent such as a water.

Further, the term "an alkali solution" and "an alkali" used herein means an agent for adjusting pH to an extent that the reducing ability of the reducing agent is not damaged, and includes, for example, a strong alkali such as KOH, NaOH, $Ca(OH)_2$, $NH_4OH$ or the like.

Moreover, it is desirable that the secondary plating solution comprises a pH adjusting agent, a reducing agent, copper ions and a complexing agent.

Among them, the pH adjusting agent is a strong alkali such as KOH, NaOH, $Ca(OH)_2$, $NH_4OH$ or the like, and preferably has a concentration of 0.1–0.5 mol/l. When the concentration of the pH adjusting agent is less than 0.1 mol/l, the reducing force of the reducing agent is lowered, while when the concentration of the pH adjusting agent exceeds 0.5 mol/l, the secondary plating bath decomposes to erode the resist for plating (insulating resin).

The reducing agent is at least one selected from aldehydes, hypophosphites, hydrogen borates and hydrazine, and preferably has a concentration of 0.02~0.08 mol/l. When the concentration of the reducing agent is less than 0.02 mol/l, the plating reaction stops, while when the concentration of the reducing agent exceeds 0.08 mol/l, the secondary plating bath decomposes.

The copper ion source is at least one selected from $CuSO_4.5H_2O$, CUO, $CuCl_2$ and $Cu(NO_3)_2$, and preferably has a concentration of 0.01~0.05 mol/l. When the concentration of the copper ions is less than 0.01 mol/l, the rate of the secondary plating reaction lowers, while when the concentration of copper ions exceeds 0.05 mol/l, the plating reaction stops.

The complexing agent is a trialkanol monoamine and preferably has a concentration of 0.02~0.10 mol/l. When the concentration of the complexing agent is less than 0.02 mol/l, copper is changed into copper oxide or copper hydroxide to cause the bath decomposition, while when the concentration of the complexing agent exceeds 0.10 mol/l, the cost undesirably increases.

BRIEF DESCRIPTION OF THE DRAWINGS

The invention will be described with reference to the accompanying drawings, wherein:

FIG. 1 is a graph showing polarization results measured on a substrate subjected to a primary plating in various solutions;

FIGS. 2(a)–2(h) are a flow sheet showing the production of an embodiment of the printed circuit board of the invention;

Figure 3A:
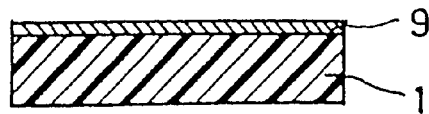
FIGS. 3(a)–3(g) are a flow sheet showing the production of an embodiment of another printed circuit board of the invention.
Figure 3B:
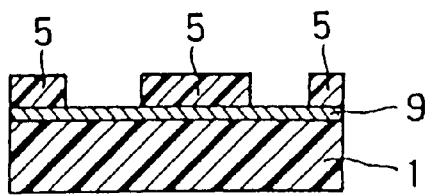

In these figures, numeral 1 is a substrate, numeral 2 a conductor circuit, numeral 3 an adhesive layer (interlaminar insulating resin layer), numeral 4 an opening for the formation of viahole, numeral 5 a resist for plating, numeral 6 a primary plated layer (electroless plated nickel layer), numeral 7 a pretreating solution, numeral 8 a secondary plated layer (electroless plated copper layer, plated nickel layer), numeral 9 a copper foil (copper), numeral 10 a solder layer, and numeral 11 a resin impregnated paper.

DESCRIPTION OF THE PREFERRED EMBODIMENTS

The details of the invention are explained with reference to FIG. 1 below.

FIG. 1 is a graph showing polarization results of the primary plated film measured at 62° C. in various solutions. In this graph, an ordinate is a current density (mA/cm$^2$) of a substrate surface or a primary plated layer surface as an substrate layer, and an abscissa is a potential thereof (V vs. SCE (Saturated Calomel Electrode); relative potential to saturated calomel standard electrode). In the abscissa, the potential becomes noble toward the positive direction, while the potential becomes base toward the negative direction.

A polarization curve C1 shows data from an electroless copper plating solution for a secondary plating containing TEA as a completing agent, specifically an electroless copper plating solution containing 4 g/l (0.0159 mol/l) of $CuSO_4.5H_2O$ as a deposition metal, 22.5 g/l (0.15 mol/l) of TEA as a complexing agent, 11 g/l (0.275 mol/l) of NaOH as a pH adjusting agent, 4 cc/l (0.049 mol/l) of HCHO as a reducing agent and small amounts of stabilizer and the like (hereinafter referred to as TEA bath simply), and a polarization curve C2 shows data from a solution obtained by removing only $CuSO_4.5H_2O$ from the above TEA bath (hereinafter referred to as copper ion free TEA bath, which is a pretreating solution according to the invention), and a polarization curve C3 shows data from a solution obtained by removing only HCHO from the above TEA bath (hereinafter referred to as reducing agent free TEA bath).

In the polarization curve C1, a hybrid potential P1 (potential at which current density is 0 mA/cm$^2$) corresponding to reaction potential of electroless copper plating is observed at about −0.78V (−0.65V~−0.85V), while a oxidizing peak of HCHO is observed at −0.78V~−0.58V and a deposition peak of copper is observed at −0.75~−1.30V. Particularly, the oxidation potential width of HCHO in the TEA solution is narrow as compared with that of the EDTA solution, and a reducing reaction peak of dissolved oxygen or the like is observed at −0.58V~−0.53V. Moreover, in the polarization curve C1, P1 (−0.78V), P4 (−0.58V) and P5 (-0.53V) are measured as a surface potential at a metastable state that the surface current density of the primary plated film is 0.

The polarization curve C2 is an oxidation polarization curve of HCHC in the TEA bath, from which it is apparent that the oxidation potential region of HCHO is −0.50V~−1.05V and the reducing reaction through HCHO is caused at this potential region. Moreover, in the curve C2, P2 (−1.05V) is measured as a surface potential at a metastable state that the surface current density of the primary plated film is 0.

The polarization curve C3 is a reducing polarization curve of Cu in the TEA bath, in which the reducing reaction peak of copper appears in a potential direction more base than about −0.68V. Moreover, in the curve C3, P3 (−0.45V) is measured as a surface potential at a metastable state that the surface current density of the primary plated film is 0.

From the above results of polarization measured, it has been found that the cause of bad initial deposition of the secondary plated film lies in the following point.

That is, when the substrate subjected to the primary plating is subjected to the secondary plating with the TEA bath indicating the behavior as the polarization curve C1, the potential of the primary plated film surface is in a direction somewhat noble than the hybrid potential P1 of the plating reaction at a time of charging into the TEA bath (e.g. a potential of about −0.5V~0V), but is shifted in a base direction after the introduction of the substrate. According to the polarization curve C1 in the TEA bath, however, the surface potentials P4, P5 of another metastable state are existent in a direction more noble than the hybrid potential P1 corresponding to the plating reaction potential, so that it has been confirmed that when the potential of the primary plated film surface is shifted into the base direction, the potential shift stops in the vicinity of the surface potentials P4, P5 and hence the plating reaction does not progress.

In secondary plating in TEA baths according to conventional techniques, therefore, the shift block of the potential near the surface potentials P4, P5 is overcome by conducting Pd-substitution treatment prior to the secondary plating. The Pd substitution treatment acts to move the polarization curve C1 toward the positive direction of the ordinate and hence the above two surface potentials P4, P5 are eliminated, whereby the shift block of the potential near P4, P5 can be overcome to allow the plating reaction to occur.

The inventors have examined the surface potential of the primary plated film in the above various solutions and confirmed that the surface potential P2 of the primary plated film in the copper ion free TEA bath shifts in a direction more base than the hybrid potential P1 of the plating reaction as shown in the polarization curve C2.

As a result, the inventors have discovered that the secondary plating reaction occurs without the Pd substitution treatment when the pretreatment with the copper ion free TEA bath is carried out instead of the Pd substitution treatment.

That is, when the surface of the primary plated film is subjected to the pretreatment with the pretreating solution for electroless plating according to the invention, the potential of the primary plated film surface being in the direction noble than the hybrid potential of the plating reaction is largely shifted in a direction more base than the hybrid potential (according to FIG. 1, the potential of about −0.5V~0 V shifts to a potential of about −1.10V~−0.90V). Then, when the substrate provided with the primary plated film is charged into the electroless plating solution for the secondary plating, the potential shifts to the noble direction and finally falls in the hybrid potential of the plating reaction (according to FIG. 1, the potential of about −1.10V~−0.90V shifts to −0.75V~−0.80V). As a result, the secondary plating reaction smoothly proceeds and hence copper plated film is surely deposited on the primary plated film without causing trouble such as lack of deposition, nodules and the like. Therefore, the Pd substitution treatment, which has hitherto been required, is unnecessary.

(1) As an electroless plating treatment technique capable of improving the initial deposition of the secondary plated film without any troubles, the inventors propose "an electroless plating method comprising: subjecting a substrate to a primary plating; after the primary plating, adjusting a surface potential of a primary plated film formed on the substrate so as to be more base than such a most base surface potential that a surface current density of the primary plated film is zero in an electroless plating solution for the secondary plating; and after the adjusting, subjecting the substrate to a secondary plating".

In general, the surface potential (natural potential) of the primary plated film in the plating solution is more noble than the hybrid potential of the electroless plating reaction due to the presence of surface oxide film. This hybrid potential is such a most base surface potential that the surface current density of the primary plated film on the substrate is 0 in the electroless plating solution for the secondary plating.

In conventional secondary plating, therefore, the substrate subjected to the primary plating is immersed in the electroless plating solution such as EDTA solution or the like to shift the surface potential of the primary plated film on the substrate in a base direction up to the hybrid potential of the plating deposition, whereby the plating deposition is created.

However, when the secondary plating solution is an electroless copper plating solution comprising a pH adjusting agent, a reducing agent, copper ions and trialkanol amine, the surface potential of metastable state that the surface current density of the primary plated film is 0 in the secondary plating solution frequently exists between the hybrid potential of the plating deposition and the surface potential of the primary plated film. For example, the polarization curve C1 of FIG. 1 shows a relationship between the surface potential and surface current density of the primary plated film in the secondary plating solution, the polarization curve C1 has surface potentials P4, P5 of such a metastable state that the surface current density is 0 in the secondary plating solution. Therefore, the surface potential of the primary plated film is converged into this potential of metastable state, and hence it is not shifted to the hybrid potential of the plating deposition and the deposition of the plating does not occur.

Now, the inventors propose a method capable of causing plating deposition without applying a catalyst such as Pd or the like by shifting the surface potential from base direction to noble direction, which is different from conventional techniques of shifting from noble direction to base direction, as an electroless plating technique capable of solving the above problem.

That is, when the secondary plating is carried out after the surface potential of the primary plated film formed on the substrate is shifted to a direction more base than such a most base surface potential that the surface current density of the primary plated film is 0 in the secondary plating solution or so-called hybrid potential of plated film deposition reaction, the surface potential of the metastable state does not occur in a direction more base than the hybrid potential of plated film deposition reaction, so that the plating deposition reaction is caused without converging the surface potential into the metastable state.

(2) In the electroless plating method according to the invention, the substrate provided with the primary plated film is immersed in the pretreating solution, or the pretreating solution is sprayed onto the substrate in order to make the surface potential of the primary plated film more base than the hybrid potential of the deposition of the secondary plated film.

The inventors propose "a pretreating solution for electroless plating comprising an alkali solution, a reducing agent and a complexing agent" or "a pretreating solution for electroless plating comprising an alkali, a reducing agent, a complexing agent and a solvent dissolving them" as the pretreating solution for the electroless plating, and propose "an electroless plating method comprising: subjecting a substrate to a primary plating; after the primary plating, pretreating the substrate with a pretreating solution for electroless plating comprising an alkali solution, a reducing agent and a complexing agent; and after the pretreating, subjecting the substrate to a secondary plating" as the electroless plating method using such a pretreating solution.

In general, the surface of the primary plated film forms a thin oxide film based on the reaction with oxygen in air or in the washing with water, so that the surface potential is the surface potential of the metal oxide. In the case of FIG. 1, for example, the surface potential of the primary plated film is about $-0.5V \sim 0V$ when the saturated calomel electrode is used as a standard electrode. That is, the surface potential of the primary plated film is more noble than the hybrid potential of the electroless plating reaction owing to the presence of the oxide film.

Therefore, the complexing agent is used in the pretreating solution to elute the metal ion of the metal oxide into solution as a metal complex through coordinate bonding under basic plating conditions, whereby a pure metal surface having no oxide film is exposed on the surface of the primary plated film. Particularly, the metal oxide of Ni, Cu or the like does not elute a metal ion of the metal oxide only under basic condition, so that the complexing agent is coexistent.

In order to shift the surface potential of the primary plated film exposed into a base direction through its reducing ability, the reducing agent is used in the pretreating solution. That is, the surface potential of the primary plated film can be shifted into a more base direction by organically acting the reducing agent.

In order to maintain the reducing ability of the reducing agent, the pH of the solution is adjusted to a given range (basic condition) by using the alkali solution or the alkali in the pretreating solution.

In the pretreating solution according to the invention, the alkali is a basic compound, which is desirably a hydroxide such as $NH_4OH$, metal hydroxide and the like. Particularly, sodium hydroxide (NaOH), lithium hydroxide (LiOH), potassium hydroxide (KOH), calcium hydroxide ($Ca(OH)_2$) and the like are desirable.

The content of the alkali is favorably 0.1~0.4 mol/l. Particularly, the concentration of NaOH is desirably 5~15 g/l (0.125~0.375 mol/l)(pH=12). When the content of the alkali is too low, the reducing force of HCHO lowers, while when the content of the pH adjusting agent is too high, the insulating resin of the substrate is attacked.

Exemplary reducing agents include hypophosphites such as $NaH_2PO_2$, $KH_2PO_2$ and the like, hydrogen borates such as $NaBH_4$, $KBH_4$ and the like, and hydrazine in addition to aldehyde. Moreover, HCHO and $CH_3CHO$ are most favorable for copper.

The content of the reducing agent is favorably 0.02~0.25 mol/l. Particularly, the concentration of HCHO is desirably 2~20 cc/l (0.0247~0.247 mol/l). When the content of HCHO is less than 2 cc/l (0.0247 mol/l), the reducing force is weak, while when the content of HCHO exceeds 20 cc/l (0.247 mol/l), the decomposition of the secondary plating solution and the degradation of operation environment are caused.

When HCHO is used as the reducing agent, it is desirable that NaOH being a strong alkali is used as the pH adjusting agent for preventing pH of not more than 9 (preferably maintaining pH of about 12).

That is, it is preferable to adjust the pH to a range of 12–13. Because, when pH is less than 12, the reducing force of HCHO is lowered, while when pH exceeds 13, the adhesive for electroless plating and the resist for plating are attacked.

In the pretreating solution according to the invention, the complexing agent is desirably at least one selected from carboxylic acid, carboxylate, tertiary amine, dioxime, dithizone, hydroxyquinoline, β-diketone and aminoacetic acid. These complexing agents easily form a complex with metal ions, particularly copper ions. These complexing agents also facilitate removal of the thin film of the metal oxide from the surface of the primary plated film to easily shift the surface potential into a base direction.

Moreover, aminoacetic acid means a compound having an amino group and a carboxyl group, and specifically includes amino acids.

As the carboxylic acid and carboxylate, there are desirable polyvalent carboxylic acids, polyvalent carboxylates, hydroxycarboxylic acids and hydroxycarboxylates. Specifically, there are tartaric acid (which is a polyvalent carboxylic acid and at the same time a hydroxycarboxylic acid), phthalic acid, maleic acid, succinic acid, fumaric acid (they are dicarboxylic acids), salicylic acid, malic acid, citric acid (they are hydroxycarboxylic acids), and salts thereof. Carboxylic acid and carboxylate easily remove the metal oxide and allow stable use of the pretreating solution for a long period of time. In addition to these polyvalent carboxylic acids, aromatic carboxylic acids such a benzoic acid and the like and salts thereof may be used.

The term "polyvalent carboxylic acid" used herein means a carboxylic acid having plural carboxyl groups, and the term "hydroxycarboxylic acid" means a carboxylic acid having hydroxyl group and carboxyl group and generally indicates "hydroxy acid" and "oxo acid". Further, the term "aromatic carboxylic acid" means a compound having a carboxyl group bonded to an aromatic ring such as benzene ring, naphthalene ring or the like.

As the tertiary amine, use may be made of ethylene diamine tetraacetate, trialkanol monoamine, nitorilo triacetate and the like. Such a complexing agent is strong in complexing force to the metal ion and excellent in the removing force of oxide film from the surface of the primary plated film. Particularly, triethanolamine (TEA), triethanol, triisopanolamine are desirable as the trialkanolamine. These amines are also used as a complexing agent in the secondary plating solution for high-speed plating, so that the secondary plating reaction is not obstructed even when these amines are used in the pretreating solution.

As the dioxime, mention may be made of dimethyl glyoxime, benzyl diglyoxime, 1,2-cyclohexane diondiglyoxime and the like. Further, the hydroxyguinoline includes oxine, and the β-diketone includes acetylacetone, and the aminoacetic acid includes amino acids such as glycine and the like.

The content of the complexing agent is preferably 0.005~0.07 mol/l. Particularly, the concentration of TEA is desirably 1~10 g/l (0.007~0.07 mol/l). When the concentration of TEA is less than 1 g/l (0.007 mol/l), the ability of removing the oxide film is lowered, while when the concentration of TEA exceeds 10 g/l (0.07 mol/l), the amount of TEA used becomes larger and the cost is undesirably high. In the pretreating solution according to the invention, tartarate of 5~30 g/l (0.0224~0.135 mol/l) may be used instead of TEA: 1~10 g/l (0.007~0.07 mol/l).

In the pretreating solution according to the invention, the alkali, the reducing agent and the complexing agent are dissolved in a solvent. As the solvent, use may be made of water, alcohol, acetonitrile and the like, particularly water is desirable. Most of reducing agents and complexing agents are dissolved in the water, and the alkali aqueous solution dissolving the alkali is basic.

In the pretreating solution according to the invention, the concentration of the metal ion to be coordinated with the complexing agent is less, which is entirely different from the electroless plating solution, so that the complexing agent is apt to be reacted with the coexisting reducing agent and particularly bonds with the aldehyde such as formaldehyde. Therefore, a stabilizer is not always required in the pretreating solution according to the invention, but is desirable to be added to prevent a reaction between the reducing agent and the complexing agent to stabilize the pretreating solution.

As the stabilizer, there are an oxidizing agent, an organic acid and a salt thereof. Specifically, it is desirable to use oxygen, ozone, hydrogen peroxide, carboxylic acid such as formic acid and acetic acid and a salt thereof. These stabilizers are relatively weak in reactivity with the reducing agent and do not adversely affect the pretreating solution. Moreover, oxygen or ozone is supplied to the solution by bubbling a gas.

The content of the stabilizer is desirably 1~30 ppm as dissolved oxygen or 1~5 g/l (0.005–0.025 mol/l) as monocarboxylic acid. When the content is less than the lower limit, the effect as the stabilizer is not obtained, while when the content exceeds the upper limit, the ability of the reducing agent is degraded.

The pretreating temperature is desirably 30° C. ~55° C. As the pretreating temperature becomes higher, the secondary plating reaction starts easily. However, when the pretreating temperature is higher than 60° C., the operation becomes difficult.

The pretreating time is desirably 1~10 minutes. When the treating time is less than 1 minute, the sufficient potential shift is not obtained, while when the pretreating time exceeds 10 minutes, the operation efficiency is lowered.

As to the pretreating solution according to the invention, the relationship between the surface potential and the surface current density of the primary plated film is measured to obtain a graph as shown in C2 of FIG. 1. In this figure, P2 is a surface potential at a state of reducing to a metal surface having no oxide film, which is more base than the hybrid potential of the deposition of secondary plated film.

Therefore, after the surface potential of the primary plated film is adjusted to the above state by the pretreating solution according to the invention, when the substrate is charged into the secondary plating solution, the surface potential shifts from base direction to noble direction to cause the plating deposition reaction without converging the surface potential into the metastable state because the surface potential of metastable state does not exist in a direction more base than hybrid potential P1 of the plated film deposition.

(3) As an electroless plating bath capable of advantageously carrying out the above electroless plating method, the invention proposes "an electroless plating bath comprising: a tank of a pretreating solution for electroless plating comprising an alkali solution, a reducing agent and a complexing agent; and a tank of an electroless plating solution comprising of a pH adjusting agent, a reducing agent, a metal ion and a complexing agent", or "an electroless plating bath comprising: a tank of a pretreating solution for electroless plating comprising an alkali, a reducing agent, a complexing agent and a solvent dissolving them; and a tank of an electroless plating solution comprising a pH adjusting agent, a reducing agent, a metal ion and a complexing agent".

As previously mentioned, according to the electroless plating method of the invention, the surface potential of the primary plated film can be shifted to a base direction by immersing in the pretreating solution or spraying the pretreating solution. However, when the primary plated film is washed with water or dried after the above pretreatment, the oxide film is formed on the primary plated film and the surface potential of the primary plated film is again shifted to a noble direction and hence the surface potential of the primary plated film becomes more noble than the hybrid potential of plating deposition at the time of charging into the secondary plating solution. Therefore, it is necessary for the primary plated film to be covered with the pretreating solution up to the time of charging into the secondary plating solution.

That is, it is necessary that once the substrate is taken out from the tank of the pretreating solution for the adjustment of surface potential, the substrate is rapidly immersed in the secondary plating solution, so that the electroless plating bath is constituted with a "tank of a pretreating solution comprising a alkali solution, a reducing agent and a complexing agent" or a "tank of a pretreating solution comprising an alkali, a reducing agent, a complexing agent and a solvent dissolving them", and a "tank of an electroless copper plating solution comprising a pH adjusting agent, a reducing agent, a metal ion and a complexing agent".

Moreover, each element constituting the secondary plating solution in the electroless plating bath according to the invention has an action similar to that of the usual plating solution. That is, the pH adjusting agent constituting the secondary plating solution maintains the plating solution at basic conditions to hold the reducing ability of the reducing agent. Under such conditions, metal forms hydroxide and precipitates, so that the metal complex is formed by the complexing agent dissolving into the plating solution. Further, the reducing agent constituting the secondary plating solution itself supplies electrons to create the reducing reaction of metal ion according to the following reaction formula:

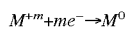

$$M^{+m} + me^- \rightarrow M^0$$

(4) According to the electroless plating bath of the invention, the substrate provided with the primary plated film is immersed in the pretreating solution or sprayed with the pretreating solution, and thereafter immersed in the secondary plating solution without washing and drying. In the electroless plating method according to the invention using the above electroless plating solution, therefore, the alkali solution or the alkali, reducing agent and complexing agent in the pretreating solution are incorporated into the secondary plating solution.

For this end, it is desirable that at least one of the alkali (i.e. pH adjusting agent), reducing agent and complexing agent is the same between the pretreating solution and the electroless plating solution in order to prevent the composition change of the plating solution to cause decomposition or sub-reaction of the plating solution.

(5) The aforementioned pretreating solution for electroless plating, electroless plating bath and electroless plating method are most suitable when the electroless copper plating solution comprising pH adjusting agent, reducing agent, copper ions and trialkanol monoamine is used as the secondary plating solution.

For example, the electroless plating using TEA as a complexing agent can realize a high-speed plating of about 30 times as compared with the electroless plating using EDTA as a complexing agent (see JP-A-1-168871). However, according to the inventors' tests, it is necessary to control the concentration of the reducing agent to about ±0.5 cc/l (0.006 mol/l) and it is required to control impurities because the presence of impurities in the plating solution lowers the reducing force to cause lack of deposition, so that it can not be said that this plating solution is practical from a cost viewpoint. The control limitation of the reducing agent and the decrease of the reducing force due to the presence impurities result from the metastable state of the primary plated film having a potential more noble than the hybrid potential.

According to the invention, the problem of lack of deposition is solved by controlling only the upper limit of the reducing agent and also the control of the impurities is not required, so that the high speed of plating deposition can surely be attained.

(6) When the electroless copper plating solution comprising pH adjusting agent, reducing agent, copper ions and TEA is used as the secondary plating solution, the polarization curve C1 of the graph shown in FIG. 1 is a relationship between the surface potential and surface current density in the primary plated film.

As seen from the polarization curve C1, when the electroless copper plating solution is used as the secondary plating solution, it is necessary that the surface potential of the primary plated film is made more base than −0.8V to the saturated calomel standard electrode by the pretreatment. Further, it is desirable that the surface potential of the primary plated film is more noble than −1.2V to the saturated calomel standard electrode. That is, the surface potential of the primary plated film is desirably −1.2V~−0.8V relative to the saturated calomel standard electrode. Because, it is very difficult to make the surface potential more base than −1.2V by chemical reducing method using formaldehyde or the like, and also when the surface potential is made more base than −1.2V, it is equal to an electrolysis potential of water to bring about the occurrence of hydrogen and the solution composition is undesirably changed.

By such an adjustment of surface potential, the surface potential of the primary plated film can be made more base than the hybrid potential of the deposition reaction of the secondary plated film to solve problems such as lack of deposition and the like.

The aforementioned pretreating solution for electroless plating, electroless plating bath and electroless plating method according to the invention can be applied to various plating techniques but also are particularly advantageous to be applied to the production of printed circuit boards.

The production of the printed circuit board will be described below.

The production of the printed circuit board using the invention lies in "a method of producing a printed circuit board by forming an adhesive layer for electroless plating on a substrate, applying a catalyst nucleus thereto, subjecting the treated substrate to a primary plating and subjecting the treated substrate to a secondary plating to form a conductor layer, characterized in that a primary plated film is treated with a pretreating solution for electroless plating comprising an alkali solution, a reducing agent and a complexing agent to shift a surface potential of the primary plated film in a direction more base than a hybrid potential of plating reaction and then the secondary plating is conducted".

This method will be described in detail below.

A. An adhesive layer is formed on a surface of a substrate such as glass epoxy substrate, polyimide substrate, ceramic substrate, metal substrate or the like according to usual manner, and then the surface of the adhesive layer is roughened with an acid or an oxidizing agent according to the usual manner, and thereafter a catalyst is applied and fixed onto the roughened surface of the adhesive layer.

The adhesive is desirably formed by dispersing heat-resistant resin powder into a resin matrix.

As the heat-resistant resin powder, use may be made of various shapes such as particles, hollow particles, ground pieces and the like. In the case of particles, it is desirable to select from ① particles having an average particle size of not more than 10 $\mu$m, ② aggregated particles having an average particle size of 2~10 $\mu$m by aggregating heat-resistant resin powder having an average particle size of not more than 2 $\mu$m, ③ a mixture of heat-resistant resin powder having an average particle size of 2~10 $\mu$m and heat-resistant resin powder having an average particle size of not more than 2 $\mu$m and ④ false particles formed by adhering at least one of heat-resistant resin powder having an average particle size of not more than 2 $\mu$m and inorganic powder having an average particle size of not more than 2 $\mu$m to surfaces of heat-resistant resin powder having an average particle size of 2~10 $\mu$m. When the average particle size of the resin particle exceeds 10 $\mu$m, the resulting anchors are deeper and hence so-called fine pattern of not more than 100 $\mu$m can not be formed. On the other hand, the resin particles of ②~④ can form complicated anchors to improve the peel strength.

B. The adhesive layer is exposed to light, developed and subjected to UV curing and thereafter subjected to a heat treatment to form a resist for plating printed into a given pattern.

When a resist for circuit boards is used by applying a composition obtained by dispersing heat-resistant powder in a heat-resistant photosensitive resin matrix onto a base film, the heat treatment is carried out after the exposure, development and UV curing to form the resist for plating printed into a given pattern.

C. If necessary, after the catalyst is activated by an acid treatment or the like, the primary electroless plating is carried out to form a primary plated thin film of a necessary conductor pattern.

D. The substrate provided with the primary plated film is immersed in the aforementioned pretreating solution for electroless plating comprising an alkali solution, a reducing agent and a complexing agent (an alkali, a reducing agent, a complexing agent and a solvent for dissolving the same) to shift the surface potential of the primary plated film in a direction more base than the hybrid potential of the plating reaction.

E. The substrate subjected to the treatment of the above item D is immersed in the secondary plating solution without drying and washing to form a secondary plated thick film.

F. In the case of a multilayer printed circuit board, the steps A-E are repeated for the multilayer formation.

G. A solder resist layer is formed by applying an uncured resin composition of liquid solder resist to the thus obtained circuit board, or by laminating an uncured solder resist film thereon. Then, the solder resist layer is exposed to light, developed and thermoset to form an opening in a part of a metal pad.

H. After the metal plated film is filled, the solder body is formed. Moreover, the formation of the solder body is carried out by reflowing a solder paste through screen printing, or by plating the solder and then reflowing it.

Another production of the printed circuit board using the invention lies in "a method of producing a printed circuit board by subjecting a metal film formed on a substrate to an electroless plating to form a conductor layer, characterized in that the electroless plating is carried out after a pretreatment with a pretreating solution for electroless plating comprising an alkali solution, a reducing agent and a complexing agent (or an alkali, a reducing agent, a complexing agent and a solvent dissolving them), a reducing agent and a complexing agent".

The metal film formed on the substrate may be a conductor pattern or a solid pattern. In the case of the solid pattern, the resist for plating is formed and the electroless plating is carried out, and thereafter the resist for plating and the metal film formed thereon are subjected to an etching.

The invention will be described in detail with reference to the following examples.

At first, the invention is explained according to FIG. 2 with respect to an example specifically attaining the electroless copper plating method in the formation of conductor pattern for the printed circuit board.

EXAMPLE 1

In this example, the electroless plating is concretely carried out according to the following.

(1) A photosensitive dry film (made by DuPont) is laminated onto a copper-lined glass epoxy laminated plate (made by Toshiba Chemical Co., Ltd.), which is exposed to an ultraviolet ray through a mask film drawn with a given conductor circuit pattern to bake this pattern image on the film. Then, the film is developed with 1,1,1-trichloroethane and copper existent in an unconductor portion is removed by an etching solution of copper chloride, and thereafter the dry film is peeled off with methylene chloride. Thus, there is prepared a circuit board having a first conductor circuit layer 2 comprised of plural conductor patterns on the substrate 1 (see FIG. 2(a)).

(2) 70 parts by weight of 25% acrylated product of cresol novolac epoxy resin (made by Nippon Kayaku Co., Ltd. molecular weight: 2500) dissolved in diethylene glycol dimethyl ether (DMDG) is mixed with 30 parts by weight of polyether sulphone (PES), 4 parts by weight of an imidazole curing agent (made by Shikoku Kasei Co. Ltd., trade name: 2E4MZ-CN), 10 parts by weight of caprolactone-modified tris(akroxyethyl) isocyanurate (made by Toa Gosei Co. Ltd., trade name: Aronix M325) as a photosensitive monomer, 5 parts by weight of benzophenone (made by Kanto Kagaku Co. Ltd.) as a photoinitiator and 0.5 part by weight of Michelar ketone (made by Kanto Kagaku Co. Ltd.) as a photosensitizer, to which is added 40 parts by weight in total of 20 parts by weight of epxoy resin particles having an average particle size of 5 pm and 20 parts by weight of epoxy resin particles having an average particle size of 0.5 pm. The resulting mixture is added with a proper amount of NMP and stirred in a homodisperser stirrer to adjust a viscosity to 2000 cps, which is further kneaded through three rolls to obtain a photosensitive adhesive solution.

(3) The photosensitive adhesive solution is applied onto circuit board of the item (1) through a roll coater, which circuit board is left to stand at a horizontal state for 20 minutes and dried at 60° C. (see FIGS. 2(b) (c)).

(4) A photomask film printed with black circles of 100 $\mu$m$\phi$ is closed onto the circuit board subjected to the treatment of item (3) and exposed to a super-high pressure mercury lamp at 500 mj/cm$^2$. This board is developed by spraying DMDG solution to form openings 4 as viaholes of 100 $\mu$m$\phi$ on the circuit board. Further, the circuit board is exposed to a super-high pressure mercury lamp at about 3000 mj/cm$^2$ and heated at 100° C. for 1 hour and further at 150° C. for 5 hours to form an interlaminar resin adhesive layer 3 of 50 μm in thickness having openings 4 corresponding to the photomask film with excellent size precision.

(5) The circuit board subjected to the treatment of item (4) is immersed in potassium permanganate (KMnO$_4$, 60 g/l (0.38 mol/l)) adjusted to pH=13 at 70° C. for 15 minutes to roughen the surface of the interlaminar insulating resin layer 3, whereby a roughened surface having fine anchors is formed on the surface of the adhesive layer 3. Then, the circuit board is immersed in a neutral solution (made by Shipley) and washed with water (see FIG. 2(d)).

(6) The substrate having the roughened surface of the adhesive layer 3 is treated with a treating solution including PdCl$_2$.2H$_2$O: 0.2 g/l (0.001 mol/l), SnCl$_2$.2H$_2$O: 15 g/l (0.067 mol/l) and HCl: 30 g/l (0.83 mol/l) to apply a catalyst nucleus onto the adhesive layer 3. The treating time is 2 minutes and the treating temperature is 35° C.

(7) A photosensitive resist is applied onto the adhesive layer 3 of the circuit board subjected to the treatment of item (6) at a thickness of 60 μm, which is prebaked, exposed to light and developed to form a resist for plating 5 on the adhesive layer 3.

(8) The circuit board subjected to the treatment of item (7) is immersed in a 10% solution of H$_2$SO$_4$ to activate the catalyst nucleus and thereafter a primary plating is carried out to non-resist forming portions through an electroless nickel plating (see FIG. 2(e)). In this primary plating, an electroless nickel plated layer 6 having a thickness of about 2 μm is formed by using an electroless nickel plating solution, which is prepared by dissolving NiSO$_4$.6H$_2$O: 30 g/l (0.113 mol/l), NaPH$_2$O$_2$.H$_2$O: 15 g/l (0.14 mol/l) and NaH$_2$C$_6$HO$_7$: 60 g/l (0.28 mol/l) in water, at a treating temperature of 60° C. for a treating time of 60 minutes. Moreover, the plating precipitation rate is 2 μm/hr.

(9) The circuit board subjected to the primary plating of item (8) is washed with water and immersed in a copper ion free TEA bath as a pretreating solution 7 of the following composition under the following treating conditions, whereby the pretreatment on the surface of the primary plated film 6 is previously conducted (see FIG. 2(f)).

[Composition of pretreating solution and treating conditions]

| | |
|---|---|
| Reducing agent (HCHO) | 10 cc/l (0.123 mol/l) |
| TEA as a complexing agent | 10 g/l (0.067 mol/l) |
| Alkali (NaOH) | 10 g/l (0.25 mol/l) (pH = 12) |
| Treating temperature | 47° C. |
| Treating time | 6 minutes |

The reducing agent, the complexing agent and the alkali are dissolved in water to make an aqueous alkali solution.

Moreover, the composition usable as the pretreating solution 7 and proper ranges of the treating conditions are as follows:

[Composition of pretreating solution and proper range of treating condition]

| | |
|---|---|
| Reducing agent (e.g. HCHO) | 2~20 cc/l (0.025~0.25 mol/l) |
| TEA as a complexing agent | 1~10 g/l (0.0067~0.067 mol/l) |
| Alkali (e.g. NaOH) | 5~15 g/l (0.125~0.375 mol/l) (pH = 12) |
| Treating temperature | 30~55° C. |
| Treating time | 1~10 minutes |

The reducing agent, the complexing agent and the alkali are dissolved in water to make an aqueous alkali solution.

(10) After the treatment of item (9), the circuit board taken out from the pretreating solution 7 is rapidly placed in an electroless copper plating solution for secondary plating without washing with water to conduct the secondary plating. In this secondary plating, an electroless copper plated layer 8 having a thickness of 21 μm is formed by using an electroless copper plating solution, which is prepared by dissolving HCHO: 3.5 cc/l (0.043 mol/l), NaOH: 5 g/l (0.125 mol/l), TEA: 8 g/l (0.054 mol/l), CUSO$_4$.5H$_2$O: 4.5 g/l (0.0179 mol/l) and a small amount of stabilizer in water, at a treating temperature of 70° C. for a treating time of 3 hours (see FIGS. 2(g) and 2(h)). Moreover, the deposition rate is 7 μm/hr.

When the thus obtained electroless copper plated layer is visually observed, there is found no lack of deposition, nodules and the like. Furthermore, there is no decomposition of the electroless copper plating solution of the secondary plating.

EXAMPLE 2

An electroless copper plated layer is formed in the same manner as in Example 1 except that tartrate is used instead of TEA as the complexing agent.

(1) The formation of adhesive layer, roughening treatment, application of catalyst nucleus, formation of resist for plating and activation treatment are carried out according to the same procedure as in Example 1.

(2) The non-resist forming portion of the circuit board after the activation treatment of item (1) is subjected to a primary plating through an electroless copper-nickel-phosphorus alloy plating. In this primary plating, an electroless copper-nickel-phosphorus alloy plated layer having a thickness of about 2 μm is formed by using an electroless copper-nickel-phosphorus alloy plating solution, which is prepared by dissolving NiSO$_4$.6H$_2$O: 20 g/l (0.075 mol/l), CuSO$_4$.5H$_2$O: 3 g/l (0.0119 mol/l), NaPH$_2$O$_2$.H$_2$O: 15 g/l (0.142 mol/l) and NaH$_2$C$_6$H$_5$O$_7$: 70 g/l (0.327 mol/l) in water, at a treating temperature of 55° C. for a treating time of 60 minutes. Moreover, the deposition rate is 2 μm/hr.

(3) The circuit board subjected to the primary plating of item (2) is washed with water and immersed in a pretreating solution containing a tartrate as a complexing agent, an alkali and a reducing agent according to the following composition (hereinafter referred to as tartaric bath) under the following treating conditions, whereby the pretreatment on the surface of the primary plated film is previously conducted.

[Composition of pretreating solution and treating conditions]

| | |
|---|---|
| Reducing agent (HCHO) | 15 cc/l (0.185 mol/l) |
| Tartrate as a complexing agent (K$_2$C$_4$H$_4$O$_6$.2H$_2$O) | 20 g/l (0.090 mol/l) |
| Alkali (NaOH) | 20 g/l (0.5 mol/l) (pH = 12) |

-continued

| [Composition of pretreating solution and treating conditions] | |
|---|---|
| Treating temperature | 50° C. |
| Treating time | 10 minutes |

The reducing agent, the complexing agent and the alkali are dissolved in water to make an aqueous alkali solution.

Moreover, the composition usable as the pretreating solution 7 and proper ranges of the treating conditions are as follows:

| [Composition of pretreating solution and proper range of treating condition] | |
|---|---|
| Reducing agent (e.g. HCHO) | 2~20 cc/l (0.025~0.25 mol/l) |
| Tartrate as a complexing agent | 5~30 g/l (0.022~0.135 mol/l) |
| Alkali (e.g. NaOH) | 5~15 g/l (0.125~0.375 mol/l) (pH = 12) |
| Treating temperature | 30~55° C. |
| Treating time | 1~10 minutes |

The reducing agent, the complexing agent and the alkali are dissolved in water to make an aqueous alkali solution.

(4) After the treatment of the item (3), the circuit board is taken out from the pretreating solution and is rapidly placed in an electroless copper plating solution for secondary plating without washing with water to conduct the secondary plating. In this secondary plating, an electroless copper plated layer having a thickness of 20 $\mu$m is formed by using an electroless copper plating solution, which is prepared by dissolving HCHO: 12 cc/l (0.148 mol/l), NaOH: 20 g/l (0.50 mol/l), $K_2C_4H_4O_6 \cdot 2H_2O$: 80 g/l (0.359 mol/l), CuS04-5H$_2$O: 8 g/l (0.032 mol/l) and a small amount of stabilizer in water, at a treating temperature of 40° C. for a treating time of 5 hours. Moreover, the deposition rate is 4 $\mu$m/hr.

When the thus obtained electroless copper plated layer is visually observed, there is found no lack of deposition, nodules and the like. Furthermore, there is no decomposition of the electroless copper plating solution for the secondary plating.

EXAMPLE 3

An electroless copper plated layer is formed in the same manner as in Example 1 except that sodium ethylenediamine tetraacetate (EDTA) is used instead of TEA as a complexing agent.

(1) The formation of adhesive layer, roughening treatment, application of catalyst nucleus, formation of resist for plating and activation treatment are carried out according to the same procedure as in Example 1.

(2) The non-resist portion of the circuit board after the activation treatment of item (1) is subjected to a primary plating through an electroless copper-nickel alloy plating. In this primary plating, an electroless copper-nickel alloy plated layer having a thickness of about 2 $\mu$m is formed by using an electroless copper-nickel alloy plating solution, which is prepared by dissolving $NiSO_4 \cdot 6H_2O$: 20 g/l (0.076 mol/l), $CuSO_4 \cdot 5H_2O$: 3 g/l (0.0119 mol/l), $NaPH_2O_2 \cdot H_2O$: 15 g/l (0.142 mol/l) and $NaH_2C_6H_5O_7$: 70 g/l (0.327 mol/l) in water, at a treating temperature of 55° C. for a treating time of 60 minutes. Moreover, the deposition rate is 2 $\mu$m/hr.

(3) The circuit board subjected to the primary plating of the item (2) is washed with water and immersed in a pretreating solution containing EDTA as a complexing agent, an alkali and a reducing agent according to the following composition (hereinafter referred to as EDTA bath) under the following treating conditions with stirring in air, whereby the pretreatment on the surface of the primary plated film is previously conducted.

| [Composition of pretreating solution and treating conditions] | |
|---|---|
| Reducing agent (HCHO) | 10 cc/l (0.123 mol/l) |
| EDTA as a complexing agent | 10 g/l (0.067 mol/l) |
| Alkali (NaOH) | 5 g/l (0.12 mol/l) (pH = 12.5) |
| Treating temperature | 50° C. |
| Treating time | 10 minutes |

The reducing agent, the complexing agent and the alkali are dissolved in water to make an aqueous alkali solution.

(4) After the treatment of item (3), the circuit board is taken out from the pretreating solution and is rapidly placed in an electroless copper plating solution for secondary plating without washing with water to conduct the secondary plating. In this secondary plating, an electroless copper plated layer having a thickness of 21 $\mu$m is formed by using an electroless copper plating solution, which is prepared by dissolving HCHO: 3.5 cc/l (0.043 mol/l), NaOH: 5 g/l (0.12 mol/l), TEA: 8 g/l (0.054 mol/l), $CUSO_4 \cdot 5H_2O$: 4.5 g/l (0.018 mol/l) and a small amount of stabilizer in water, at a treating temperature of 70° C. for a treating time of 3 hours. Moreover, the deposition rate is 7 um/hr.

When the thus obtained-electroless copper plated layer is visually observed, there is found no lack of precipitation, nodules and the like. Furthermore, there is no decomposition of the electroless copper plating solution for the secondary plating. Moreover, the stirring in air is carried out at the pretreatment step, so that the treating solution can be used over a long time without color change.

EXAMPLE 4

An electroless copper plated layer is formed in the same manner as in Example 1 except that a pretreating solution containing a stabilizer is used.

(1) The formation of adhesive layer, roughening treatment, application of catalyst nucleus, formation of resist for plating, activation treatment and electroless nickel plating as a primary plating are carried out according to the same procedure as in Example 1. (2) The circuit board subjected to the primary plating of the item (1) is washed with water and immersed in a pretreating solution containing $H_2O_2$ as a stabilizer according to the following composition under the following treating conditions, whereby the pretreatment on the surface of the primary plated film is conducted.

| [Composition of pretreating solution and treating conditions] | |
|---|---|
| Reducing agent (HCHO) | 20 cc/l (0.25 mol/l) |
| TEA as a complexing agent | 8 g/l (0.054 mol/l) |
| Alkali (NaOH) | 12 g/l (0.30 mol/l) (pH = 12.5) |
| Stabilizer ($H_2O_2$) | 2 cc/l (0.03 mol/l) |
| Treating temperature | 55° C. |
| Treating time | 5 minutes |

The reducing agent, the complexing agent and the alkali are dissolved in water to make an aqueous alkali solution.

(3) After the treatment of the item (2), the circuit board is taken out from the pretreating solution and is rapidly placed in an electroless copper plating solution for secondary plating without washing with water to conduct the secondary plating. In this secondary plating, an electroless copper plated layer having a thickness of 18 μm is formed by using an electroless copper plating solution, which is prepared by dissolving HCHO: 1.5 cc/l (0.0185 mol/l), NaOH: 8 g/l (0.20 mol/l), TEA: 8 g/l (0.054 mol/l), $CuSO_4.5H_2O$: 4 g/l (0.016 mol/l) and a small amount of stabilizer in water, at a treating temperature of 65° C. for a treating time of 3 hours. Moreover, the deposition rate is 6 pm/hr.

When the thus obtained electroless copper plated layer is visually observed, there is found no lack of deposition, nodules and the like. Furthermore, $H_2O_2$ is included in the pretreating solution as a stabilizer, so that the treating solution can be used over a long time without color change.

EXAMPLE 5

An electroless copper plated layer is formed in the same manner as in Example 1 except that aminoacetic acid is used instead of TEA as a complexing agent.

(1) The formation of adhesive layer, roughening treatment, application of catalyst nucleus, formation of resist for plating, activation treatment and electroless nickel plating as a primary plating are carried out according to the same procedure as in Example 1.

(2) The circuit board subjected to the primary plating of item (1) is washed with water and immersed in a pretreating solution containing aminoacetic acid as a complexing agent according to the following composition under the following treating conditions, whereby the pretreatment on the surface of the primary plated film is conducted.

| [Composition of pretreating solution and treating conditions] | |
|---|---|
| Reducing agent (HCHO) | 15 cc/l (0.185 mol/l) |
| Aminoacetic acid as a complexing agent | 5 g/l (0.033 mol/l) |
| Alkali (NaOH) | 14 g/l (0.35 mol/l) |
| Stabilizer | small amount |
| Treating temperature | 45° C. |
| Treating time | 3 minutes |

The reducing agent, the complexing agent and the alkali are dissolved in water to make an aqueous alkali solution.

(3) After the treatment of item (2), the circuit board is taken out from the pretreating solution and is rapidly placed in an electroless copper plating solution for secondary plating without washing with water to conduct the secondary plating. In this secondary plating, an electroless copper plated layer having a thickness of 16 μm is formed by using an electroless copper plating solution, which is prepared by dissolving HCHO: 4 cc/l (0.049 mol/l), NaOH: 10 g/l (0.25 mol/l), TEA: 5 g/l (0.033 mol/l), $CuSO_4.5H_2O$: 4 g/l (0.016 mol/l) and a small amount of stabilizer in water, at a treating temperature of 60° C. for a treating time of 3 hours. Moreover, the deposition rate is 6 pm/hr.

When the thus obtained electroless copper plated layer is visually observed, there is found no lack of deposition, nodules and the like.

EXAMPLE 6

An electroless copper plated layer is formed in the same manner as in Example 1 except that benzoic acid is used instead of TEA as a complexing agent.

(1) The formation of adhesive layer, roughening treatment, application of catalyst nucleus, formation of resist for plating, activation treatment and electroless nickel plating as a primary plating are carried out according to the same procedure as in Example 1.

(2) The circuit board subjected to the primary plating of item (1) is washed with water and immersed in a pretreating solution containing benzoic acid as a complexing agent of the following composition under the following treating conditions, whereby the pretreatment on the surface of the primary plated film is conducted.

| [Composition of pretreating solution and treating conditions] | |
|---|---|
| Reducing agent (HCHO) | 15 cc/l (0.185 mol/l) |
| Benzoic acid as a complexing agent | 10 g/l (0.067 mol/l) |
| Alkali (NaOH) | 14 g/l (0.35 mol/l) |
| Stabilizer | small amount |
| Treating temperature | 50° C. |
| Treating time | 3 minutes |

The reducing agent, the complexing agent and the alkali are dissolved in water to make an aqueous alkali solution.

(3) After the treatment of item (2), the circuit board is taken out from the pretreating solution and is rapidly placed in an electroless copper plating solution for secondary plating without washing with water to conduct the secondary plating. In this secondary plating, an electroless copper plated layer having a thickness of 16 um is formed by using an electroless copper plating solution, which is prepared by dissolving HCHO: 4 cc/l (0.049 mol/l), NaOH: 10 g/l (0.25 mol/l), $CuSO_4.5H_2O$: 4 g/l (0.016 mol/l) and a small amount of stabilizer in water, at a treating temperature of 60° C. for a treating time of 3 hours. Moreover, the deposition rate is 6 μm/hr.

When the thus obtained electroless copper plated layer is visually observed, there is found no lack of deposition, nodules and the like.

EXAMPLE 7

An electroless copper plated layer is formed in the same manner as in Example 1 except that sodium dihydrogen citrate is used instead of TEA as a complexing agent.

(1) The formation of adhesive layer, roughening treatment, application of catalyst nucleus, formation of resist for plating, activation treatment and electroless nickel plating as a primary plating are carried out according to the same procedure as in Example 1.

(2) The circuit board subjected to the primary plating of item (1) is washed with water and immersed in a pretreating solution containing sodium dihydrogen citrate as a complexing agent according to the following composition under the following treating conditions, whereby the pretreatment on the surface of the primary plated film is conducted.

| [Composition of pretreating solution and treating conditions] | |
|---|---|
| Reducing agent (HCHO) | 10 cc/l (0.123 mol/l) |
| Sodium dihydrogen citrate ($NaH_2C_6H_5O_7$) as a complexing agent | 10 g/l (0.047 mol/l) |
| Alkali (NaOH) | 11 g/l (0.275 mol/l) |
| Stabilizer | small amount |
| Treating temperature | 50° C. |
| Treating time | 3 minutes |

The reducing agent, the complexing agent and the alkali are dissolved in water to make an aqueous alkali solution.

(3) After the treatment of item (2), the circuit board is taken out from the pretreating solution and is rapidly placed in an electroless copper plating solution for secondary plating without washing with water to conduct the secondary plating. In this secondary plating, an electroless copper plated layer having a thickness of 16 µm is formed by using an electroless copper plating solution, which is prepared by dissolving of HCHO: 4 cc/l (0.049 mol/l), NaOH: 10 g/l (0.25 mol/l), TEA: 5 g/l (0.335 mol/l), $CuSO_4.5H_2O$: 4 g/l (0.016 mol/l) and a small amount of stabilizer in water, at a treating temperature of 60° C. for a treating time of 3 hours. Moreover, the deposition rate is 6 µm/hr.

When the thus obtained electroless copper plated layer is visually observed, there is found no lack of precipitation, nodules and the like.

EXAMPLE 8

An electroless copper plated layer is formed in the same manner as in Example 1 except that dioxime, dithizone, hydroquinoline, β-diketone and nitrilotriacetic acid are used instead of TEA as a complexing agent. Moreover, glyoxime. is used as the dioxime, and 8-hydroxyquinoline (oxine) is used as the hydroquinoline, and acetylacetone is used as β-diketone.

(1) The steps of formation of adhesive layer, roughening treatment, application of catalyst nucleus, formation of resist for plating, activation treatment and electroless nickel plating as a primary plating are carried out according to the same procedure as in Example 1.

(2) The circuit board subjected to the primary plating of item (1) is washed with water and immersed in a pretreating solution containing the above complexing agents according to the following composition under the following treating conditions, whereby the pretreatment on the surface of the primary plated film is conducted. Moreover, the complexing agents other than nitorilotriacetic acid used in this example are hardly soluble in water, so that they are dissolved in an alcohol such as methanol, ethanol and the like or a polar organic solvent such as acetonitrile or the like and then dissolved in an aqueous alkali solution dissolving the reducing agent to prepare the pretreating solution of the following composition.

| [Composition of pretreating solution and treating conditions] | |
|---|---|
| Reducing agent (sodium boron hydride) | 5 g/l (0.15 mol/l) |
| Complexing agents | 5~10 g/l |
| glyoxime | 0.056 mol/l |
| dithizone | 0.039 mol/l |
| oxine | 0.069 mol/l |
| nitorilotriacetic acid | 0.052 mol/l |
| acetylacetone | 0.050 mol/l |
| (use of these complexing agents alone) | |
| Alkali (NaOH) | 14 g/l (0.35 mol/l) |
| Stabilizer | small amount |
| methanol, ethanol or acetonitrile | 1 cc/l |
| Treating temperature | 45° C. |
| Treating time | 3 minutes |

The reducing agent, the complexing agent and the alkali are dissolved in water to make an aqueous alkali solution.

(3) After the treatment of item (2), the circuit board is taken out from the pretreating solution and is rapidly placed in an electroless copper plating solution for secondary plating without washing with water to conduct the secondary plating. In this secondary plating, an electroless copper plated layer having a thickness of 16 µm is formed by using an electroless copper plating solution, which is prepared by dissolving HCHO: 4 cc/l (0.049 mol/l), NaOH: 10 g/l (0.25 mol/l), TEA: 5 g/l (0.034 mol/l), $CuSO_4.5H_2O$: 4 g/l (0.016 mol/l) and a small amount of stabilizer in water, at a treating temperature of 60° C. for a treating time of 3 hours. Moreover, the deposition rate is 6 µm/hr.

When the thus obtained electroless copper plated layer is visually observed, there is found no lack of deposition, nodules and the like.

Comparative Example

In this comparative example, the electroless copper plated layer is formed in the same manner as in Example 1 except that the catalyst nucleus is applied without conducting the pretreatment of the surface of the primary plated film.

(1) The formation of adhesive layer, roughening treatment, application of catalyst nucleus, formation of resist for plating and activation treatment are carried out according to the same procedure as in Example 1.

(2) The non-resist portion of the circuit board after the activation treatment of item (1) is subjected to a primary plating through an electroless copper-nickel alloy plating. In this primary plating, an electroless copper-nickel alloy plated layer having a thickness of about 2 µm is formed by using an electroless copper-nickel alloy plating solution, which is prepared by dissolving $NiSO_4.6H_2O$: 20 g/l (0.075 mol/l), $CuSO_4.5H_2O$: 3 g/l (0.012 mol/l), $NaPH_2O_2.H_2$: 15 g/l (0.142 mol/l) and $NaH_2C_6H_5O_7$: 70 g/l (0.327 mol/l) in water, at a treating temperature of 55° C. for a treating time of 60 minutes. Moreover, the plating deposition rate is 2 µm/hr.

(3) The circuit board subjected to the primary plating of item (2) is immersed in an aqueous solution of hydrochloric acid having a Pd concentration of 50 ppm for 5 minutes to apply a Pd catalyst, washed with water and charged into an electroless copper plating solution for a secondary plating to conduct the seondary plating, but the plated film is not deposited. The secondary plating is carried out by using an electroless copper plating solution, which is prepared by dissolving HCHO: 2.0 cc/l (0.025 mol/l), NaOH: 5 g/l (0.12 mol/l), TEA: 8 g/l (0.054 mol/l), $CuSO_4.5H_2O$: 4.5 g/l (0.0179 mol/l) and a small amount of stabilizer in water, at a treating temperature of 70° C. for a treating time of 3 hours.

Now, the secondary plating is carried out by changing the electroless copper plating solution to a composition of HCHO: 3.5 cc/l (0.043 mol/l), NaOH: 5 g/l (0.12 mol/l), TEA: 8 g/l (0.054 mol/l), $CuSO_4.5H_2O$: 4.5 g/l (0.0179 mol/l) and a small amount of stabilizer at a treating temperature of 70° C. for a treating time of 3 hours. As a result, an electroless copper plated layer having a thickness of 21pm is formed.

Figure 5A:
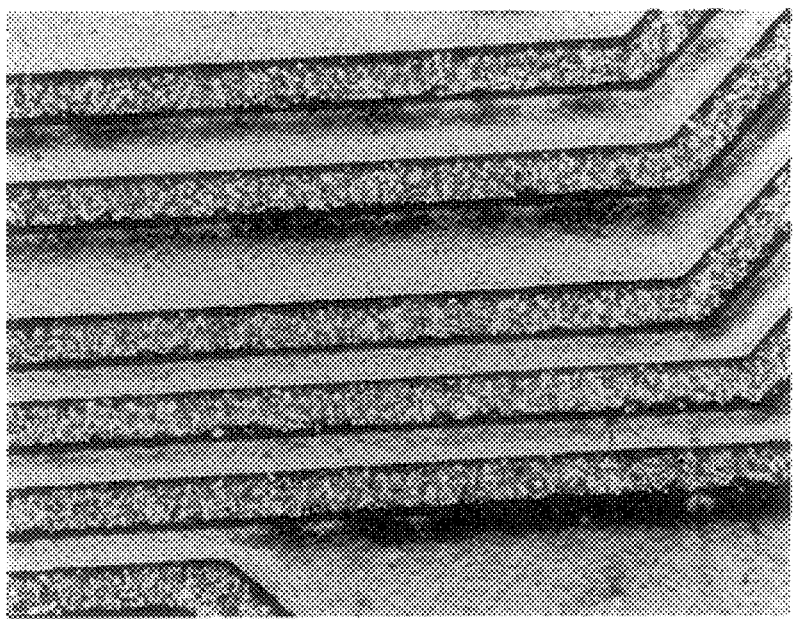
FIGS. 5(a) and (b) are microphotographs showing conductor patterns of the Example and the Comparative Example.
Figure 5B:
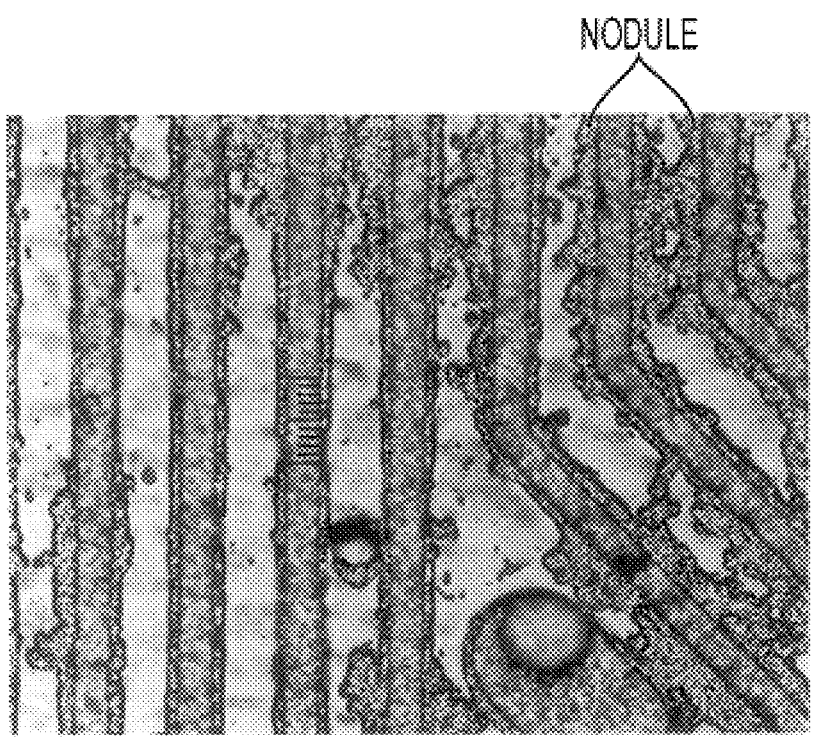

When the thus obtained electroless copper plated layer is visually observed, however, nodules are found in the resist portion for the plating (see FIG. 5).

The electroless copper plating method for the formation of another conductor pattern in the printed circuit board according to the invention will be specifically described according to FIG. 3.

EXAMPLE 9

(1) A copper-lined glassepoxy laminate (copper: 18 µm, see FIG. 3(a)) is subjected to a black reducing treatment to roughen the surface of the copper foil 9. Then, a photosensitive dry film is laminated thereon and exposed to an ultraviolet ray through a mask film pictured with a desirable conductor circuit pattern to bake an image thereon. Then, it is developed with 1,1,1-trichloroethane (see FIG. 3(b)).

(2) The substrate subjected to the treatment of item (1) is immersed in a copper ion free TEA bath as a pretreating solution of the following composition under the following conditions to conduct the pretreatment for the surface of the copper foil 9.

[Composition of pretreating solution and treating conditions]

| | |
|---|---|
| Reducing agent (HCHO) | 10 cc/l (0.123 mol/l) |
| TEA as a complexing agent | 10 g/l (0.67 mol/l) |
| Alkali (NaOH) | 10 g/l (0.25 mol/l) (pH = 12) |
| Treating temperature | 47° C. |
| Treating time | 6 minutes |

The reducing agent, the complexing agent and the alkali are dissolved in water to make an aqueous alkali solution.

Figure 3C:
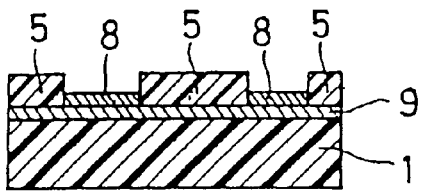

(3) After the treatment of item (2), the circuit board is taken out from the pretreating solution and is rapidly placed in an electroless copper plating solution without washing with water to conduct the plating (see FIG. 3(c)). In this electroless copper plating, an electroless copper plated layer having a thickness of 17 μm is formed by using an electroless copper plating solution, which is prepared by dissolving HCHO: 3.5 cc/l (0.043 mol/l), NaOH: 5 g/l (0.12 mol/l), TEA: 8 g/l (0.054 mol/l), CUSO$_4$.5H$_2$O: 4.5 g/l (0.0179 mol/l) and a small amount of stabilizer in water, at a treating temperature of 70° C. for a treating time of 3 hours. Moreover, the deposition rate is 7 μm/hr.

When the thus obtained electroless copper plated layer is visually observed, there is found no lack of deposition, nodules and the like. Furthermore, the decomposition of the electroless copper plating solution is not caused.

Figure 3D:
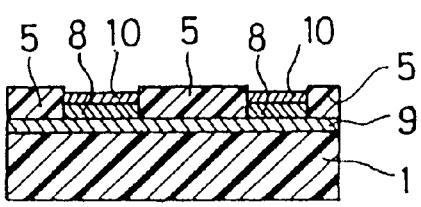
Figure 3E:
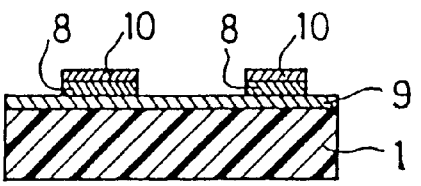
Figure 3F:
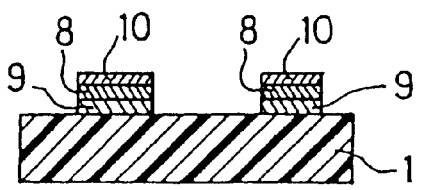
Figure 3G:
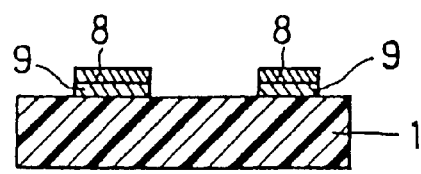

(4) The surface of the electroless copper plated layer formed in item (3) is subjected to a solder plating (see FIG. 3(d)), and then a resist 5 for plating is removed (see FIG. 3(e)), and further the copper foil 9 at the portion of the resist 5 is removed by using an etching solution (copper diamine chloride, copper chloride) (see FIG. 3(f)), and a solder layer 10 formed by the solder plating is peeled off (see FIG. 3(g)), whereby a conductor layer having a thickness of 35 μm is formed.

The production of a decorative plate according to the invention will be specifically described according to FIG. 4.

EXAMPLE 10

(1) A craft paper having a basis weight of 112 g/m$^2$ and containing 35% of titanium oxide (white) is impregnated with a melamine resin, which is dried to obtain a resin impregnated paper 11. In this case, the impregnation ratio (impregnation ratio=resin amount/weight of whole resin impregnated paper) is 200%.

Figure 4A:
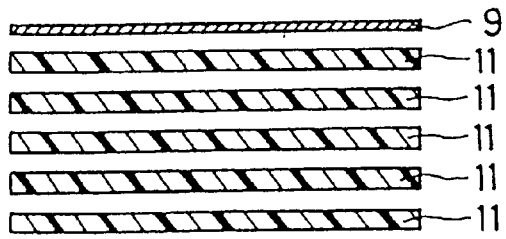
FIGS. 4(a)–4(e) are a flow sheet showing the production of an embodiment of the decorative board of the invention.
Figure 4B:
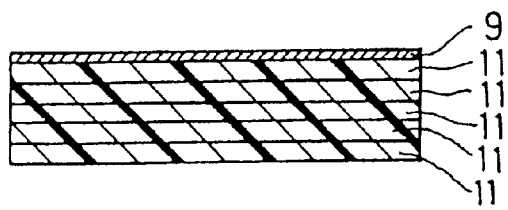

(2) Five resin impregnated papers 11 obtained in item (1) and a copper foil 9 of 10 μm are laminated and hot pressed at 150° C. under 80 kg/cm$^2$ for 60 minutes to produce a melamine resin substrate having the copper foil 9 at its surface (see FIGS. 4(a)(b)).

(3) The copper lined melamine resin substrate is immersed in a pretreating solution of the following composition under the following conditions to conduct the pretreatment for the surface of the copper foil 9.

[Composition of pretreating solution and treating conditions]

| | |
|---|---|
| Reducing agent (HCHO) | 10 cc/l (0.123 mol/l) |
| Sodium dihydrogen citrate as a complexing agent | 70 g/l (0.327 mol/l) |
| Alkali (NaOH) | 0.25 mol/l (pH = 12) |
| Treating temperature | 47° C. |
| Treating time | 6 minutes |

The reducing agent, the complexing agent and the alkali are dissolved in water to make an aqueous alkali solution.

(4) After the pretreatment of the item (3), the substrate is taken out from the pretreating solution and is rapidly placed in an electroless nickel plating solution of the following composition without washing and drying to conduct the electroless plating.

[Composition of plating solution and treating conditions]

| | |
|---|---|
| Reducing agent (sodium phosphinate) | 0.2 mol/l |
| Nickel sulfate as a metal salt (6 crystal water) | 0.05 mol/l |
| Sodium dihydrogen citrate as a complexing agent | 70 mmol/l |
| Plating temperature | 60° C. |
| pH | 10 |
| Treating time | 10 hours |

The reducing agent, the complexing agent and the metal salt are dissolved in water to make an aqueous alkali solution.

Figure 4C:
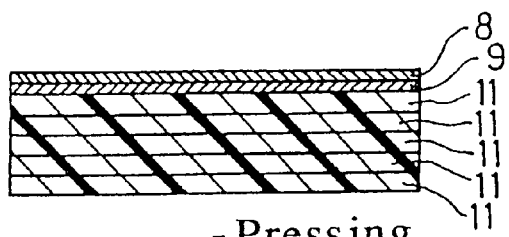

Thus, a nickel plated layer 8 of a metallic gloss is deposited on the copper lined melamine resin substrate without applying a catalyst, in which the thickness of the plated layer 8 is 20 μm (see FIG. 4(c)).

(5) A melamine resin is impregnated into a craft paper having a basis weight of 112 g/m$^2$ and having an ash content of 0.1% by weight and dried to obtain a resin impregnated paper 11. In this case, the impregnation ratio (impregnation ratio=resin amount/weight of whole resin impregnated paper) is 200%.

Figure 4D:
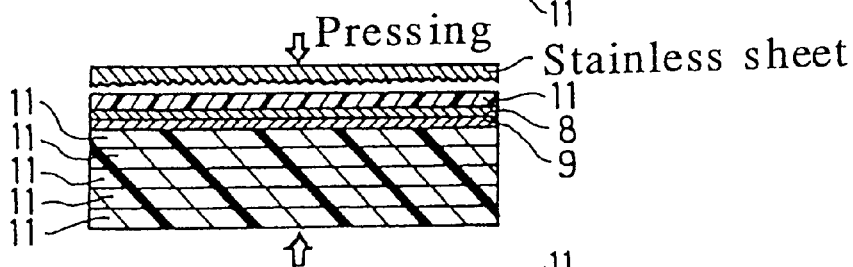
Figure 4E:
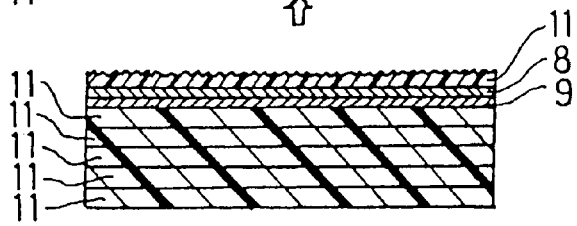

(6) The resin impregnated paper 11 obtained in item (5) is laminated onto the nickel plated substrate obtained in items (1)–(4), and an embossed stainless sheet is disposed on the surface thereof, which is hot pressed at 150° C. under 80 kg/cm for 60 minutes to produce a metallic melamine decorative plate having undulaitons on its surface (see FIGS. 4(d)(e)).

The thus produced decorative plate has a transparent resin layer having a very small ash content as an outermost layer and this resin layer is subjected to embossing finish, so that light reflected on the nickel plated layer is deflected and scattered on the surface to develop a bright effect just like a lens and hence a decorative plate having a high grade and an excellent design can be provided.

As mentioned above, the plating reaction can surely be promoted without drawbacks such as lack of deposition, nodules and the like according to the electroless plating method of the invention carrying out the aforementioned pretreatment.

Furthermore, it is possible to surely deposit the electroless copper plated layer on a substrate layer (primary plated film, metal film) without conducting the Pd substitution treatment required in conventional techniques. As a result, the present invention solves various problems resulting from the Pd substitution treatment (high cost, abnormal plating deposition, premature degradation of bath, difficulty of controlling Pd concentration and the like).

In the electroless plating method according to the invention, the electroless copper plated layer can be obtained in a shorter time by using TEA bath or tartaric bath having a relatively fast plating precipitation rate as compared with the conventional EDTA bath. In addition, the aforementioned pretreatment can be carried out in a short time of about 1–10 minutes by merely immersing the substrate into the pretreating solution. Therefore, the method of the invention is excellent with respect to cost and operability.

And also, the secondary plating solution and the pretreating solution in Examples 1, 2 and 4 have the same kind of complexing agent and are very similar in the solution composition except that copper ions are present or absent as a deposition metal ion (the ratio of the component in both solutions is somewhat different). Therefore, even if the pretreating solution adhered to the surface of the circuit board is introduced into the electroless copper plating solution for the secondary plating, the composition of the electroless copper plating solution is not largely changed. That is, the degradation of the electroless copper plating solution for the secondary plating resulting from the introduction of the pretreating solution can be minimized according to the method of the invention.

In the above examples, it is possible to make the following exemplary modifications:

① In Example 2, the complexing agent in the pretreating solution and the electroless copper plating solution for the secondary plating may be changed into sodium tartrate.

② In Examples 1 and 2, after the pretreatment is carried out with the pretreating solution containing TEA as a complexing agent, the secondary plating may be carried out with the electroless copper plating solution containing a tartrate as a complexing agent. Alternatively, after the pretreatment is carried out with the pretreating solution containing a tartrate as a complexing agent, the secondary plating may be carried out with the electroless copper plating solution containing TEA as a complexing agent. That is, the complexing agent in the pretreating solution is not necessarily the same as the complexing agent in the electroless copper plating solution for the secondary plating.

③ As the pretreatment, for example, the spraying method may be adopted in addition to the immersion method described in the examples.

④ Even if a small amount of copper ions is included in the pretreating solution (i.e. a slight amount as compared with the usual electroless copper plating solution), there is no trouble in the pretreatment.

⑤ The primary plated layer as a substrate layer may be formed, for example, by electroless copper plating solution, electroless cobalt plating solution or the like in addition to the electroless nickel plating solution and electroless copper-nickel plating solution described in the above examples.

⑥ Although the above examples are described with respect to the electroless copper plating method for the formation of conductor pattern in the printed circuit board and the application to metal-like melamine decorative plate, the invention is not limited to these applications and are applicable to electroless plating for automobile parts, building materials and the like.

INDUSTRIAL APPLICABILITY

As mentioned above, according to the invention, the plating reaction can be promoted without the Pd substitution treatment and it is possible to accelerate the rate of plating precipitation.

What is claimed is:

1. An electroless plating method comprising:
    subjecting a substrate to a primary plating comprising depositing a plated film on a catalyst nucleus;
    after the primary plating, pretreating the substrate with a pretreating solution for electroless plating comprising an alkali, a reducing agent, a complexing agent and a solvent dissolving the alkali, reducing agent and complexing agent; and
    after the pretreating, subjecting the substrate to a secondary plating comprising electroless plating.

2. An electroless plating method according to claim 1, wherein the reducing agent in the pretreating solution for electroless plating is at least one selected from aldehydes, hypophosphites, hydrogen borates and hydrazine.

3. An electroless plating method according to claim 1, wherein the complexing agent in the pretreating solution for electroless plating is at least one selected from carboxylic acid, carboxylate, tertiary amine, dioxime, dithizone, hydroxyquinoline, β-diketone and aminoacetic acid.

4. An electroless plating method according to claim 1, wherein the complexing agent in the pretreating solution for electroless plating is at least one selected from polyvalent carboxylic acid, polyvalent carboxylate, aromatic carboxylic acid, aromatic carboxylate, hydroxcarboxylic acid, hydroxycarboxylate, trialkanol monoamine, ethylene diamine tetraacetate, dimethylglyoxime, benzyldiglyoxime, 1,2-cyclohexanedion diglyoxime, oxine, acetylacetone, glycine and nitrilotriacetate.

5. An electroless plating method according to claim 1, wherein the complexing agent in the pretreating solution for electroless plating is at least one selected from tartaric acid, tartrate and triethanol amine.

6. An electroless plating method according to claim 1, wherein the secondary plating uses an electroless copper plating solution comprising a pH adjusting agent, a reducing agent, copper ions and trialkanol amine.

7. An electroless plating method according to claim 1, wherein the primary plating comprises electroless plating of a film to form a conductor pattern.

8. An electroless plating method comprising:
    subjecting a substrate to a primary plating comprising depositing a primary plated film on a catalyst nucleus;
    after the primary plating, adjusting a surface potential of the primary plated film formed on the substrate so as to be more base than such a most base surface potential that a surface current density of the primary plated film is zero in an electroless plating solution for the secondary plating; and
    after the adjusting, subjecting the substrate to a secondary plating comprising electroless plating.

9. An electroless plating method according to claim 8, wherein the secondary plating uses an electroless copper plating solution comprising a pH adjusting agent, a reducing agent, copper ions and trialkanol amine.

10. An electroless plating method according to claim 8, wherein the primary plated film comprises a conductor pattern.

11. An electroless plating method comprising:
    subjecting a substrate to a primary plating comprising depositing a primary plated film on a catalyst nucleus;
    after the primary plating, adjusting a surface potential of [a] the primary plated film formed on the substrate by using a pretreating solution for electroless plating comprising an alkali solution, a reducing agent and a complexing agent, so as to be more base than such a most base surface potential that a surface current density of the primary plated film is zero in an electroless plating solution for the secondary plating; and after the adjusting, subjecting the substrate to a secondary plating comprising electroless plating.

12. An electroless plating method according to claim 11, wherein the reducing agent in the pretreating solution for electroless plating is at least one selected from aldehydes, hypophosphites, hydrogen borates and hydrazine.

13. An electroless plating method according to claim 11, wherein the complexing agent in the pretreating solution for electroless plating is at least one selected from carboxylic acid, carboxylate, tertiary amine, dioxime, dithizone, hydroxyquinoline, β-diketone and aminoacetic acid.

14. An electroless plating method according to claim 11, wherein the complexing agent in the pretreating solution for electroless plating is at least one selected from polyvalent carboxylic acid, polyvalent carboxylate, aromatic carboxylic acid, aromatic carboxylate, hydroxcarboxylic acid, hydroxycarboxylate, trialkanol monoamine, ethylene diamine tetraacetate, dimethylglyoxime, benzyldiglyoxime, 1,2-cyclohexanedion diglyoxime, oxine, acetylacetone, glycine and nitrilotriacetate.

15. An electroless plating method according to claim 11, wherein the complexing agent in the pretreating solution for electroless plating is at least one selected from tartaric acid, tartrate and triethanol amine.

16. An electroless plating method according to claim 11, wherein the secondary plating uses an electroless copper plating solution comprising a pH adjusting agent, a reducing agent, copper ions and trialkanol amine.

17. An electroless plating method according to claim 11, wherein the primary plated film comprises a conductor pattern.

18. An electroless plating method comprising:

subjecting a substrate to a primary plating comprising depositing a primary plated film on a catalyst nucleus;

after the primary plating, adjusting a surface potential of [a] the primary plated film formed on the substrate by using a pretreating solution for electroless plating comprising an alkali, a reducing agent, a complexing agent and a solvent for dissolving the alkali, reducing agent and complexing agent, so as to be more base than such a most base surface potential that a surface current density of the primary plated film is zero in an electroless plating solution for the secondary plating; and after the adjusting, subjecting the substrate to a secondary plating comprising electroless plating.

19. An electroless plating method according to claim 18, wherein the reducing agent in the pretreating solution for electroless plating is at least one selected from aldehydes, hypophosphites, hydrogen borates and hydrazine.

20. An electroless plating method according to claim 18, wherein the complexing agent in the pretreating solution for electroless plating is at least one selected from carboxylic acid, carboxylate, tertiary amine, dioxime, dithizone, hydroxyquinoline, P-diketone and aminoacetic acid.

21. An electroless plating method according to claim 18, wherein the complexing agent in the pretreating solution for electroless plating is at least one selected from polyvalent carboxylic acid, polyvalent carboxylate, aromatic carboxylic acid, aromatic carboxylate, hydroxcarboxylic acid, hydroxycarboxylate, trialkanol monoamine, ethylene diamine tetraacetate, dimethylglyoxime, benzyldiglyoxime, 1,2-cyclohexanedion diglyoxime, oxine, acetylacetone, glycine and nitrilotriacetate.

22. An electroless plating method according to claim 18, wherein the complexing agent in the pretreating solution for electroless plating is at least one selected from tartaric acid, tartrate and triethanol amine.

23. An electroless plating method according to claim 18, wherein the secondary plating uses an electroless copper plating solution comprising a pH adjusting agent, a reducing agent, copper ions and trialkanol amine.

24. An electroless plating method according to claim 18, wherein the primary plated film comprises a conductor pattern.

25. An electroless plating method comprising:

subjecting a substrate to a primary plating comprising depositing a primary plated film on a catalyst nucleus;

after the primary plating, adjusting a surface potential of the primary plated film formed on the substrate by using a pretreating solution for electroless plating comprising an alkali solution, a reducing agent and a complexing agent, so as to be more base than '0.8 V of a saturated calomel electrode as a standard electrode; and after the adjusting, subjecting the substrate to a secondary plating comprising electroless plating.

26. An electroless plating method according to claim 25, wherein the reducing agent in the pretreating solution for electroless plating is at least one selected from aldehydes, hypophosphites, hydrogen borates and hydrazine.

27. An electroless plating method according to claim 25, wherein the complexing agent in the pretreating solution for electroless plating is at least one selected from carboxylic acid, carboxylate, tertiary amine, dioxime, dithizone, hydroxyquinoline, β-diketone and aminoacetic acid.

28. An electroless plating method according to claim 25, wherein the complexing agent in the pretreating solution for electroless plating is at least one selected from polyvalent carboxylic acid, polyvalent carboxylate, aromatic carboxylic acid, aromatic carboxylate, hydroxcarboxylic acid, hydroxycarboxylate, trialkanol monoamine, ethylene diamine tetraacetate, dimethylglyoxime, benzyldiglyoxime, 1,2-cyclohexanedion diglyoxime, oxine, acetylacetone, glycine and nitrilotriacetate.

29. An electroless plating method according to claim 25, wherein the complexing agent in the pretreating solution for electroless plating is at least one selected from tartaric acid, tartrate and triethanol amine.

30. An electroless plating method according to claim 25, wherein the primary plated film comprises a conductor pattern.

31. An electroless plating method comprising:

subjecting a substrate to a primary plating comprising depositing a plated film on a catalyst nucleus;

after the primary plating, adjusting a surface potential of a primary plated film formed on the substrate by using a pretreating solution for electroless plating comprising an alkali, a reducing agent, a complexing agent and a solvent for dissolving the alkali, reducing agent and complexing agent, so as to be more base than -0.8 V of a saturated calomel electrode as a standard electrode; and after the adjusting, subjecting the substrate to a secondary plating comprising electroless plating.

32. An electroless plating method according to claim 31, wherein the reducing agent in the pretreating solution for electroless plating is at least one selected from aldehydes, hypophosphites, hydrogen borates and hydrazine.

33. An electroless plating method according to claim 31, wherein the complexing agent in the pretreating solution for electroless plating is at least one selected from carboxylic acid, carboxylate, tertiary amine, dioxime, dithizone, hydroxyquinoline, β-diketone and aminoacetic acid.

34. An electroless plating method according to claim 31, wherein the complexing agent of the pretreating solution for electroless plating is at least one selected from polyvalent carboxylic acid, polyvalent carboxylate, aromatic carboxylic acid, aromatic carboxylate, hydroxcarboxylic acid, hydroxycarboxylate, trialkanol monoamine, ethylene diamine tetraacetate, dimethylglyoxime, benzyldiglyoxime, 1,2-cyclohexanedion diglyoxime, oxine, acetylacetone, glycine and nitrilotriacetate.

35. An electroless plating method according to claim 31, wherein the complexing agent in the pretreating solution for electroless plating is at least one selected from tartaric acid, tartrate and triethanol amine.

* * * * *

UNITED STATES PATENT AND TRADEMARK OFFICE
CERTIFICATE OF CORRECTION

PATENT NO.   : 6,146,700
DATED        : November 14, 2000
INVENTOR(S)  : B. Yuan et al.

It is certified that error appears in the above-identified patent and that said Letters Patent is hereby corrected as shown below:

Column 28,
Line 17, (claim 25, line 11) delete, "than '0.8 V" should be -- than -0.8 V--.

Title page,
Item [56], References Cited, Foreign Patent Documents, line 8, "23077" should be -- 230770 --.
Item [56], References Cited, Other Publications, line 7, "2-3070" should be -- 2-30770 --.

Signed and Sealed this

Sixteenth Day of October, 2001

Attest:

NICHOLAS P. GODICI
Attesting Officer    Acting Director of the United States Patent and Trademark Office